(12) United States Patent
Chang et al.

(10) Patent No.: US 12,426,151 B2
(45) Date of Patent: Sep. 23, 2025

(54) CIRCUIT BOARD AND LAYOUT METHOD THEREOF

(71) Applicant: HTC Corporation, Taoyuan (TW)

(72) Inventors: Che-Jung Chang, Taoyuan (TW); Chia-Chu Ho, Taoyuan (TW); Huan Yi Chu, Taoyuan (TW)

(73) Assignee: HTC Corporation, Taoyuan (TW)

( * ) Notice: Subject to any disclaimer, the term of this patent is extended or adjusted under 35 U.S.C. 154(b) by 189 days.

(21) Appl. No.: 18/180,871

(22) Filed: Mar. 9, 2023

(65) Prior Publication Data

US 2024/0306291 A1 Sep. 12, 2024

(51) Int. Cl.
*H05K 1/02* (2006.01)

(52) U.S. Cl.
CPC ......... *H05K 1/0298* (2013.01); *H05K 1/0218* (2013.01); *H05K 1/0219* (2013.01); *H05K 1/0224* (2013.01); *H05K 1/025* (2013.01); *H05K 2201/0707* (2013.01)

(58) Field of Classification Search
CPC .. H05K 1/0298; H05K 1/0245; H05K 1/0219; H05K 1/0218; H05K 1/0221; H05K 1/0224; H05K 1/0253; H05K 2201/0707; H05K 2201/0715; H05K 2201/0723; H05K 1/025
See application file for complete search history.

(56) References Cited

U.S. PATENT DOCUMENTS

| | | | | | |
|---|---|---|---|---|---|
| 3,700,825 | A | * | 10/1972 | Taplin | H01B 7/08 174/117 FF |
| 5,300,899 | A | * | 4/1994 | Suski | H05K 1/0224 174/254 |
| 5,334,800 | A | * | 8/1994 | Kenney | H05K 1/0224 174/250 |
| 5,633,479 | A | * | 5/1997 | Hirano | H05K 1/0253 174/262 |
| 5,675,299 | A | * | 10/1997 | Suski | H05K 1/0224 333/1 |
| 7,465,882 | B2 | * | 12/2008 | Becker | H05K 1/0219 361/795 |
| 10,757,800 | B1 | * | 8/2020 | Bergman | H01P 3/085 |
| 2001/0010271 | A1 | * | 8/2001 | Lin | H05K 1/0253 174/268 |

(Continued)

FOREIGN PATENT DOCUMENTS

CN 106332435 1/2017

OTHER PUBLICATIONS

"Office Action of Taiwan Counterpart Application", issued on Jun. 24, 2024, pp. 1-11.

*Primary Examiner* — Steven T Sawyer
(74) *Attorney, Agent, or Firm* — JCIPRNET

(57) ABSTRACT

A circuit board and a layout method thereof are provided. The circuit board includes a first metal layer, a second metal layer, and a third metal layer. The first metal layer forms multiple first reference conductive wires. The second metal layer forms at least one signal transmission wire. The third metal layer forms multiple third reference conductive wires. The first metal layer, the second metal layer, and a third metal layer are overlapped with each other, and each of the first reference conductive wires is not completely overlapped with each of the second reference conductive wires.

16 Claims, 4 Drawing Sheets

(56) References Cited

U.S. PATENT DOCUMENTS

2010/0225424 A1* 9/2010 Yeates .................. H01P 11/003
                                                          29/829
2021/0185798 A1* 6/2021 Yoshida ................ H10F 39/806
2023/0036379 A1* 2/2023 Yoshida ................ H05K 1/028

* cited by examiner

CIRCUIT BOARD AND LAYOUT METHOD THEREOF

TECHNICAL FIELD

The disclosure relates to a circuit board and a layout method thereof, and in particular to a circuit board capable of improving signal transmission efficiency and a layout method thereof.

DESCRIPTION OF RELATED ART

About the signal transmission wire for high-speed transmission in a circuit board, the quality of signal transmission is often affected due to the direction, size, and parasitic effect of the signal transmission wire.

In the prior art, the designer sets a corresponding reference conductive wire for the high-speed signal transmission wire in the circuit board. Through the shielding effect of the reference conductive wire, the increase in transmission impedance caused by the interference of an external electromagnetic wave on the signal transmission wire is reduced. However, due to the limitation of the layout area, the reference conductive wire can usually have a shielding effect on the signal transmission wire only in a limited region. As a result, the signal transmission wire in the prior art often has poor uniformity of signal transmission impedance, which reduces the quality of signal transmission.

SUMMARY

The disclosure provides a circuit board and a layout method thereof, which can improve the uniformity of transmission impedance of a signal transmission wire.

The circuit board of the disclosure includes a first metal layer, a second metal layer, and a third metal layer. The first metal layer forms multiple first reference conductive wires. The second metal layer forms at least one signal transmission wire. The third metal layer forms multiple second reference conductive wires. The first metal layer, the second metal layer, and the third metal layer are overlapped with each other, and each first reference conductive wire is not completely overlapped with each second reference conductive wire.

The layout method of the disclosure includes: forming multiple first reference conductive wires in a first metal layer; forming at least one signal transmission wire in a second metal layer; forming multiple second reference conductive wires in a third metal layer, wherein the first metal layer, the second metal layer, and the third metal layer are overlapped with each other; and enabling each first reference conductive wire to be not completely overlapped with each second reference conductive wire.

Based on the above, in the circuit board of the disclosure, the first reference conductive wires are not completely overlapped with the second reference conductive wires in different metal layers. In this way, the signal transmission wire may have multiple overlapping parts with the first reference conductive wire and the second reference conductive wire, which can improve the uniformity of the transmission impedance of the signal transmission wire and improve the efficiency of signal transmission.

DESCRIPTION OF THE EMBODIMENTS

Figure 1:
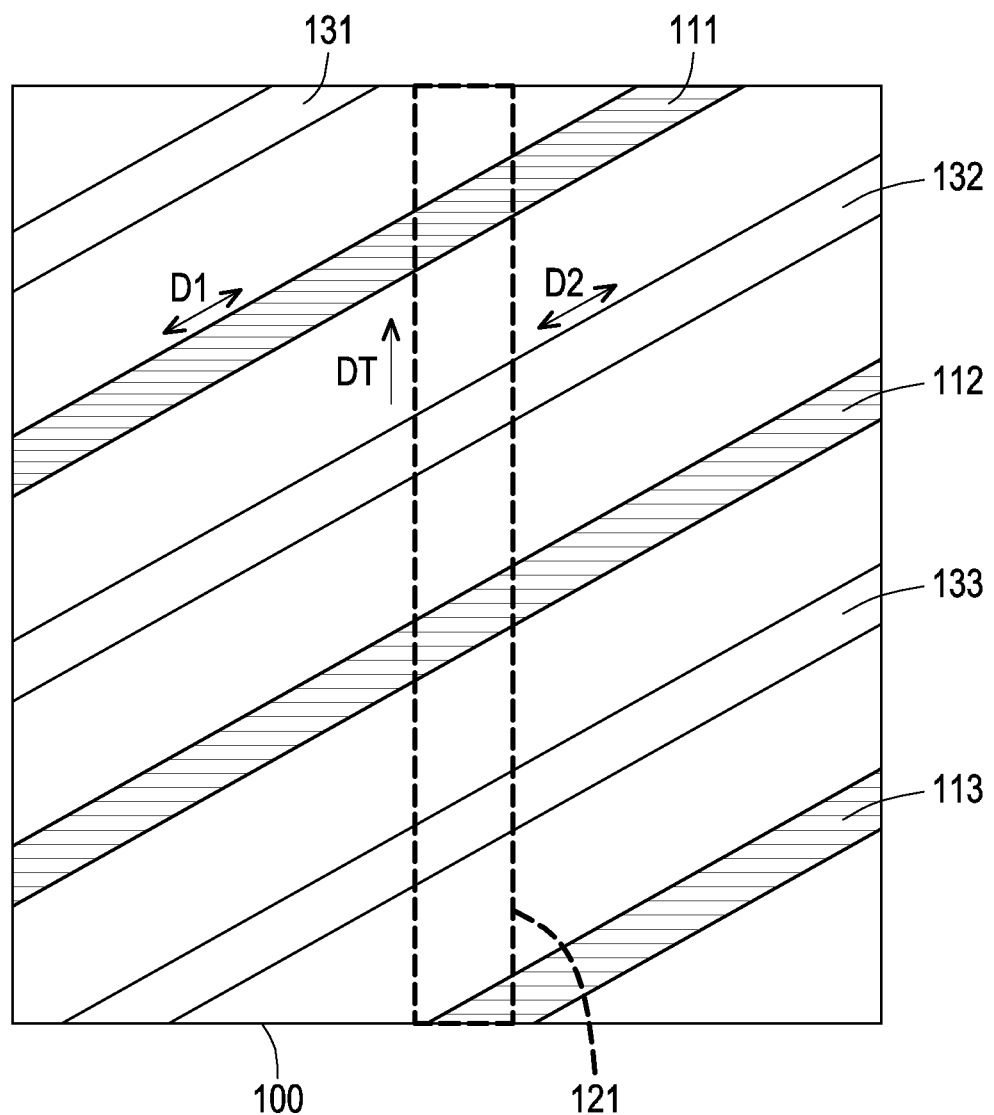
FIG. 1 is a schematic top view of a circuit board according to an embodiment of the disclosure.

Please refer to FIG. 1, which is a schematic top view of a circuit board according to an embodiment of the disclosure. A circuit board 100 may be a multi-layer circuit board, and the circuit board 100 may respectively have a first metal layer, a second metal layer, and a third metal layer among multiple layers. The first metal layer, the second metal layer, and the third metal layer are stacked on each other. Multiple reference conductive wires 111 to 113 may be formed in the first metal layer. The reference conductive wires 111 to 113 may extend along a direction D1, and any two of the reference conductive wires 111 to 113 may be parallel to each other. At least one signal transmission wire 121 may be formed in the second metal layer. In this embodiment, the signal transmission wire 121 may extend along a direction DT, wherein the direction DT and the direction D1 are not parallel to each other, and there may be a non-zero included angle therebetween. In addition, multiple reference conductive wires 131 to 133 may be formed in the third metal layer. The reference conductive wires 131 to 133 may extend along a direction D2, and any two of the reference conductive wires 131 to 133 may be parallel to each other. In addition, in this embodiment, the direction D2 and the direction D1 may be parallel to each other. That is, the direction DT and the direction D2 are also not parallel to each other, and there may be a non-zero included angle therebetween.

In this embodiment, the signal transmission wire 121 may respectively have partially overlapping regions with the reference conductive wires 111, 132, 112, and 133. The reference conductive wires 111, 132, 112, and 133 may receive a reference ground voltage, and provide multiple reference planes for the signal transmission wire 121 through multiple partially overlapping regions. In this way, based on the partially overlapping regions, the continuity of the signal transmission impedance of the signal transmission wire 121 may be increased, effectively improving the efficiency of signal transmission.

Incidentally, in this embodiment, the first metal layer forming the reference conductive wires 111 to 113 may be disposed at the outermost layer of the circuit board 100; the third metal layer forming the reference conductive wires 131 to 133 may be disposed at the bottom layer of the circuit board 100; and the second metal layer of the signal transmission wire 121 may be disposed at the middle layer of the circuit board 100, that is, between the first metal layer and the third metal layer.

In this embodiment, the lengths and widths of the reference conductive wires 111 to 113 and 131 to 133 are not limited and may be adjusted according to the size of the circuit board 100 and the actual layout. The widths of the reference conductive wires 111 to 113 and 131 to 133 may be the same, partially the same, or all different, and there is no special limitation.

In addition, in this embodiment, the signal transmission wire 121 in the second metal layer may be a high-speed signal transmission wire. The number of the signal transmission wire 121 may be one or more. In other embodiments of the disclosure, the signal transmission wire 121 may not extend only along the single direction DT, but may be segmented to have multiple extending directions.

The point is that in the circuit board 100 of the embodiment of the disclosure, the reference conductive wires 111 to 113 and 131 to 133 of different metal layers may be staggered, so that the overlapping regions between the signal transmission wire 121 and the reference conductive wires 111 to 113 and 131 to 133 may be effectively increased, thereby improving the uniformity of the signal transmission impedance of the signal transmission wire 121.

Incidentally, there is no specific limitation on the materials of the reference conductive wires 111 to 113 and 131 to 133 and the signal transmission wire 121. As is well known to persons skilled in the art, materials of metal wires that may be applied on printed circuit boards may be used to implement the reference conductive wires 111 to 113 and 131 to 133 and the signal transmission wire 121, and there is no specific limitation.

Please refer to FIG. 2 below, which is a schematic top view of a circuit board according to another embodiment of the disclosure. A circuit board 200 may also be a multi-layer circuit board, and the circuit board 200 may respectively have a first metal layer, a second metal layer, and a third metal layer among multiple layers. The first metal layer, the second metal layer, and the third metal layer are stacked on each other. Multiple reference conductive wires 211 to 215 may be formed in the first metal layer. The reference conductive wires 211 to 213 may extend along the direction D1, and any two of the reference conductive wires 211 to 213 may be parallel to each other. The reference conductive wires 214 to 215 may extend along a direction D3, and any two of the reference conductive wires 214 to 215 may be parallel to each other. Multiple reference conductive wires 231 to 235 may be formed in the third metal layer. The reference conductive wires 231 to 233 may extend along the direction D2, and any two of the reference conductive wires 231 to 233 may be parallel to each other. The reference conductive wires 234 to 235 may extend along a direction D4, and any two of the reference conductive wires 234 to 235 may be parallel to each other.

In this embodiment, the directions D1 and D3 may be parallel to each other; the directions D2 and D4 may be parallel to each other; and the directions D1 and D2 are not parallel to each other.

In this embodiment, the slopes of the direction D1 and the direction D2 may be additive inverses of each other. In other embodiments of the disclosure, the slopes of the direction D1 and the direction D2 may also be set arbitrarily and are not limited.

On the other hand, the second metal layer is used to form a signal transmission wire 221. The signal transmission wire 221 may be extended in a single segment or in multiple segments along any direction and respectively has multiple partially overlapping regions with the reference conductive wires 211, 212, 214, and 215 and the reference conductive wires 232 to 235.

Similar to the foregoing embodiments, in the circuit board 200 of the embodiment of the disclosure, the reference conductive wires 211 to 215 and 231 to 235 of different metal layers may be staggered, so that the overlapping regions of the signal transmission wire 221 and the reference conductive wires 211 to 215 and 231 to 235 may be effectively increased, thereby improving the uniformity of the signal transmission impedance of the signal transmission wire 221. In this embodiment, the reference conductive wires 211 to 213 and 214 to 215 extend in different directions D1 and D3, and the reference conductive wires 231 to 233 and 234 to 235 extend in different directions D2 and D4 to further increase the overlapping regions between the signal transmission wire 221 and the reference conductive wires 211 to 215 and 231 to 235.

Figure 3:
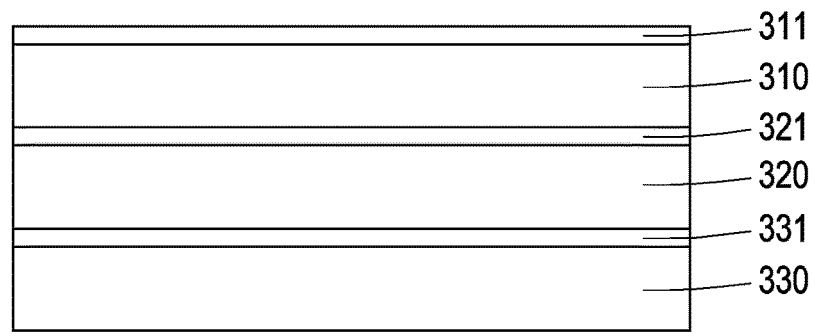
FIG. 3 is a schematic structural view of a circuit board according to an embodiment of the disclosure.

Please refer to FIG. 3, which is a schematic structural view of a circuit board according to an embodiment of the disclosure. A circuit board 300 has multiple layers 310, 320, and 330. The layers 310, 320, and 330 respectively have a first metal layer 311, a second metal layer 321, and a third metal layer 331 thereon. Multiple reference conductive wires may be formed in each of the first metal layer 311 and the third metal layer 331. One or more signal transmission wires are formed in the second metal layer 321. The reference conductive wire receives a reference ground voltage and may provide a reference plane for the signal transmission wire.

Figure 2:
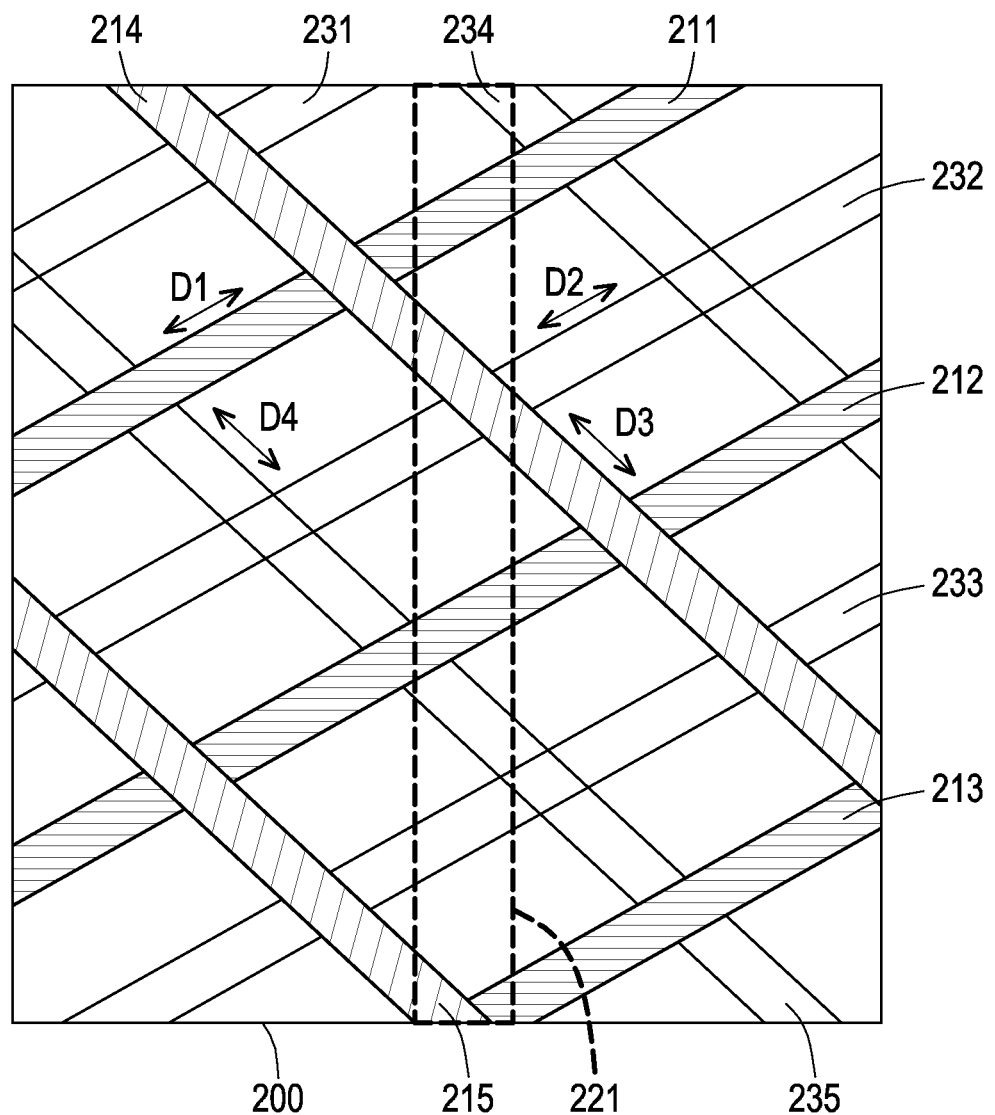
FIG. 2 is a schematic top view of a circuit board according to another embodiment of the disclosure.

The arrangement of the signal transmission wires and the reference conductive wires has been described in detail in the embodiments of FIGS. 1 and 2, and will not be repeated here.

Figure 4:
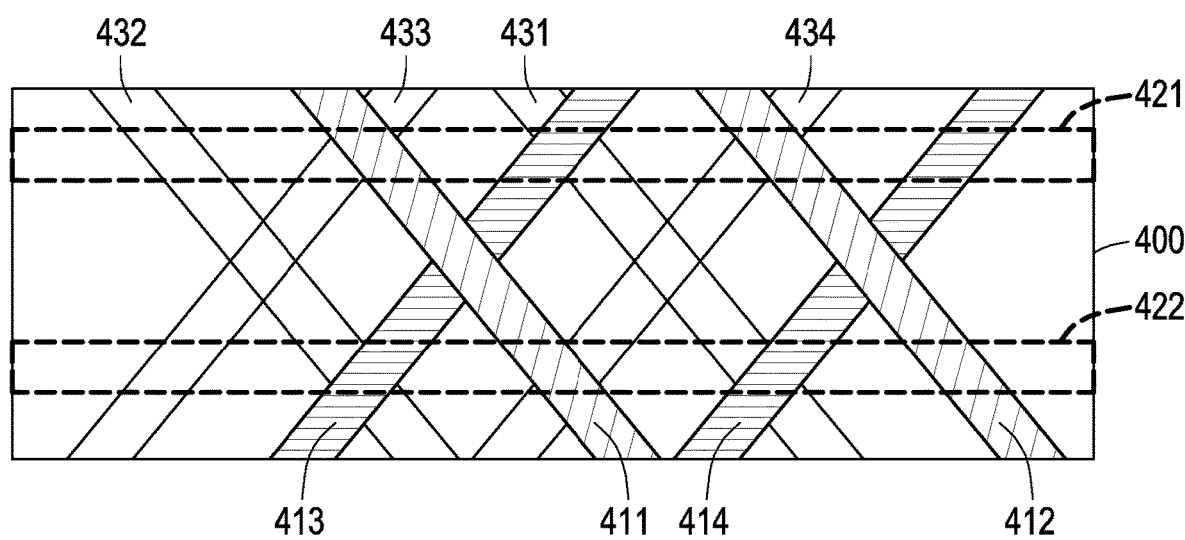
FIG. 4 is a schematic top view of a circuit board according to another embodiment of the disclosure.

Please refer to FIG. 4, which is a schematic top view of a circuit board according to another embodiment of the disclosure. A circuit board 400 may be a multi-layer circuit board, and the circuit board 400 may respectively have a first metal layer, a second metal layer, and a third metal layer among multiple layers. The first metal layer, the second metal layer, and the third metal layer are stacked on each other. Multiple reference conductive wires 411 to 414 may be formed in the first metal layer. The reference conductive wire 411 and the reference conductive wire 412 are parallel to each other and there is an offset distance therebetween. The reference conductive wire 411 and the reference conductive wire 413 intersect with each other to form an "X" shape. The reference conductive wire 413 and the reference conductive wire 414 are parallel to each other and there is an offset distance therebetween. The reference conductive wire 412 and the reference conductive wire 414 intersect with each other to form an "X" shape.

In addition, multiple reference conductive wires 431 to 434 may be formed in the third metal layer. The reference conductive wire 431 and the reference conductive wire 432 are parallel to each other and there is an offset distance therebetween. The reference conductive wire 431 and the reference conductive wire 433 intersect with each other to form an "X" shape. The reference conductive wire 433 and the reference conductive wire 434 are parallel to each other and there is an offset distance therebetween. The reference conductive wire 432 and the reference conductive wire 434 intersect with each other to form an "X" shape. In addition, the reference conductive wires 431, 433, and 434 respectively have another offset distance from the reference conductive wires 411, 413, and 414, so that the reference conductive wires 431, 433, and 434 are not overlapped with the reference conductive wires 411, 413, and 414. In this embodiment, the reference conductive wire 413 is partially overlapped with the reference conductive wires 431 and 432; the reference conductive wire 411 is partially overlapped with the reference conductive wires 433 and 434; the reference conductive wire 414 is partially overlapped with the reference conductive wire 431; and the reference conductive wire 412 is partially overlapped with the reference conductive wire 434.

The signal transmission wires 421 and 422 are formed in the second metal layer. In this embodiment, the signal transmission wire 421 may have multiple partially overlapping regions with the reference conductive wires 432, 411, 433, 413, 431, 434, 412, and 414. Similarly, the signal transmission wire 422 may have multiple partially overlapping regions with the reference conductive wires 433, 432, 413, 411, 434, 431, 421, and 412. Through the partially overlapping regions, the uniformity of the transmission impedance of the signal transmission wires 421 and 422 of the embodiment of the disclosure may be effectively improved, thereby improving the efficiency of signal transmission.

Figure 5:
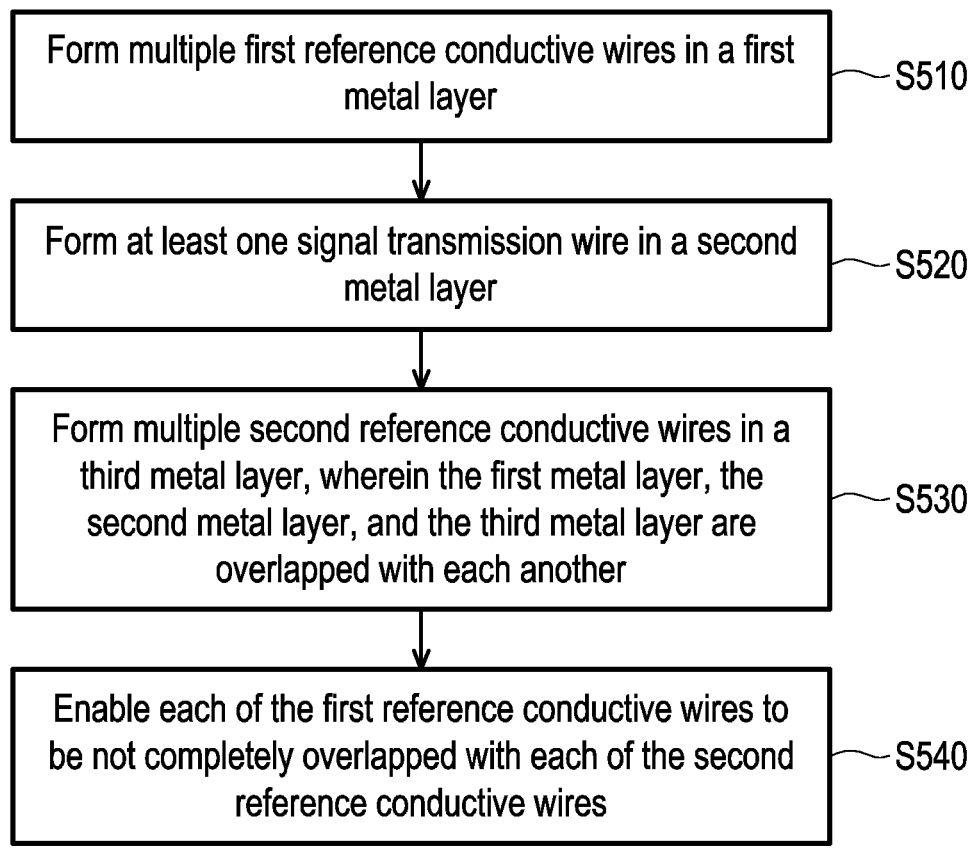
FIG. 5 is a flowchart of a circuit layout method of a circuit board according to an embodiment of the disclosure.

Please refer to FIG. 5, which is a flowchart of a circuit layout method of a circuit board according to an embodiment of the disclosure. In Step S510, multiple first reference conductive wires are formed in a first metal layer. In Step S520, at least one signal transmission wire is formed in a second metal layer. In Step S530, multiple second reference conductive wires are formed in a third metal layer, wherein the first metal layer, the second metal layer, and the third metal layer are overlapped with each other. In Step S540, each first reference conductive wire is not completely overlapped with each second reference conductive wire.

The implementation details of the above steps have been described in detail in the foregoing embodiments and will not be repeated here.

To sum up, in the circuit board of the disclosure, the reference conductive wires in different metal layers are staggered, so that the area of the partially overlapping regions between the signal transmission wire and the reference conductive wires may be effectively increased, effectively improving the uniformity of the transmission impedance of the signal transmission wire and effectively improving the transmission efficiency of signals.

What is claimed is:

1. A circuit board, comprising: a first metal layer, forming a plurality of first reference conductive wires; a second metal layer, forming at least one signal transmission wire; and a third metal layer, forming a plurality second reference conductive wires, wherein the first metal layer, the second metal layer, and the third metal layer are overlapped with each other, each of the first reference conductive wires is not completely overlapped with each of the second reference conductive wires, the signal transmission wire is partially overlapped with the first reference conductive wires and the second reference conductive wires, and the first reference conductive wires and the second reference conductive wires are arranged to increase an area of partially overlapping regions between the signal transmission wire, the first reference conductive wires and second reference conductive wires, wherein an extension direction of each of the plurality of first reference conductive wires is not orthogonal to an extension direction of each of the plurality of second reference conductive wires; wherein the first reference conductive wires and the second reference conductive wires receive a reference ground voltage.

2. The circuit board of claim 1, wherein the second metal layer is disposed between the first metal layer and the third metal layer.

3. The circuit board of claim 1, wherein the first reference conductive wires extend along a first direction, and the first reference conductive wires are parallel to each other.

4. The circuit board of claim 3, wherein the second reference conductive wires extend along the first direction, and the second reference conductive wires are parallel to each other and are parallel to the first reference conductive wires.

5. The circuit board of claim 4, wherein the first metal layer also forms a plurality of third reference conductive wires, wherein the third reference conductive wires extend along a second direction, the third reference conductive wires are parallel to each other, and the first direction is different from the second direction.

6. The circuit board of claim 5, wherein the third metal layer also forms a plurality of fourth reference conductive wires, wherein the fourth reference conductive wires extend along the second direction, the fourth reference conductive wires are parallel to each other and are parallel to the third reference conductive wires.

7. The circuit board of claim 5, wherein a slope of the first direction and a slope of the second direction are additive inverses of each other.

8. The circuit board of claim 1, wherein the at least one signal transmission wire is partially overlapped with a plurality of the first reference conductive wires and a plurality of the second reference conductive wires.

9. A circuit layout method, comprising: forming a plurality of first reference conductive wires in a first metal layer; forming at least one signal transmission wire in a second metal layer; forming a plurality of second reference conductive wires in a third metal layer, wherein the first metal layer, the second metal layer, and the third metal layer are overlapped with each other; enabling each of the first reference conductive wires to be not completely overlapped with each of the second reference conductive wires, and arranging the signal transmission wire to be partially overlapped with the first reference conductive wires and the second reference conductive wires, wherein the first reference conductive wires and the second reference conductive wires are arranged to increase an area of partially overlapping regions between the signal transmission wire, the first reference conductive wires and second reference conductive wires, wherein an extension direction of each of the plurality of first reference conductive wires is not orthogonal to an extension direction of each of the plurality of second reference conductive wires; receiving a reference ground voltage by the first reference conductive wires and second reference conductive wires.

10. The circuit layout method of claim 9, wherein the second metal layer is disposed between the first metal layer and the third metal layer.

11. The circuit layout method of claim 9, further comprising:
extending the first reference conductive wires along a first direction, wherein the first reference conductive wires are parallel to each other.

12. The circuit layout method of claim 11, further comprising:
extending the second reference conductive wires along the first direction, wherein the second reference conductive wires are parallel to each other and are parallel to the first reference conductive wires.

13. The circuit layout method of claim 12, further comprising:
forming a plurality of third reference conductive wires in the first metal layer, wherein the third reference conductive wires extend along a second direction, the third reference conductive wires are parallel to each other, and the first direction is different from the second direction.

14. The circuit layout method of claim 13, further comprising:
forming a plurality of fourth reference conductive wires in the third metal layer, wherein the fourth reference conductive wires extend along the second direction, and the fourth reference conductive wires are parallel to each other and are parallel to the third reference conductive wires.

15. The circuit layout method of claim 13, wherein a slope of the first direction and a slope of the second direction are additive inverses of each other.

16. The circuit layout method of claim 9, further comprising:
enabling the at least one signal transmission wire to be partially overlapped with a plurality of the first reference conductive wires and a plurality of the second reference conductive wires.

* * * * *